United States Patent [19]

Seevinck

[11] Patent Number: 4,607,235
[45] Date of Patent: Aug. 19, 1986

[54] AMPLIFIER ARRANGEMENT COMPRISING A PROTECTION CIRCUIT

[75] Inventor: Evert Seevinck, Enschede, Netherlands

[73] Assignee: U.S. Philips Corporation, New York, N.Y.

[21] Appl. No.: 711,782

[22] Filed: Mar. 14, 1985

[30] Foreign Application Priority Data

Mar. 15, 1984 [NL] Netherlands ................ 8400822

[51] Int. Cl.$^4$ ............................................. H03F 3/04
[52] U.S. Cl. ................................. 330/298; 330/207 P
[58] Field of Search .................. 330/207 P, 298, 273

[56] References Cited

U.S. PATENT DOCUMENTS 4,402,029  8/1983  Fujita ............................ 330/207 P Primary Examiner—Gene Wan
Attorney, Agent, or Firm—Thomas A. Briody; William J. Streeter; Marianne R. Rich

[57] ABSTRACT

A protection circuit for a power amplifier in which feedback is applied from the output to the inverting input of the amplifier by a negative feedback network comprising a first resistor, a second resistor and a capacitor, comprises a voltage-current converter whose input is connected to the output of the amplifier which is loaded by a load and whose output is connected to the junction point of the second resistor and the capacitor. When the protection circuit is activated if the output transistors of the amplifier are loaded excessively for example due to short-circuiting of the load, the input voltage of the voltage-current converter, for low frequencies, is converted into a current which is re-converted into a voltage in the capacitor, which voltage is added to the normal negative-feedback voltage provided by the voltage divider comprising the first resistor and the second resistor. This provides a strong negative feedback and hence a satisfactory protection. For higher frequencies the capacitor constitutes a short circuit, so that the negative feedback changes to the normal feedback, thus ensuring that the amplifier remains stable under all conditions. The amplifier is then protected by the thermal cut-out which is normally present.

8 Claims, 6 Drawing Figures

AMPLIFIER ARRANGEMENT COMPRISING A PROTECTION CIRCUIT

BACKGROUND OF THE INVENTION

1. Field of the Invention

The invention relates to an amplifier arrangement comprising a first amplifier stage having a first input which is the inverting input of the amplifier arrangement, a second input which is the non-inverting input of the amplifier arrangement, and an output, a second ampliefier stage having an input which is coupled to the output of the first amplifier stage, at least a first output transistor and an output coupled to said transistor, a negative-feedback network comprising a first resistor arranged between the output of the second amplifier stage and the inverting input of the amplifier arrangement and a second resistor and a capacitor arranged in series between the inverting input and a reference potential, and a protection circuit for protecting the first output transistor, which protection circuit has an output.

Such an amplifier arrangement may be used in integrated power amplifiers for audio equipment. The output transistors of such amplifier arrangements must be operated in the SOAR range (Safe operating Area Rating) in order to preclude damage to the output transistors due to overloading by an excess current and/or an excess voltage.

2. Description of the Prior Art

Such an amplifier arrangement is described in the non-prepublished Netherlands patent application Nos. 8300078 (PHN 10.546) and 8302197 (PHN 10.712). The output of the protection circuit does not act on the base of the output transistors, as is customary, but on the input of the second amplifier stage. This results in a high loop gain of the protection loop, thereby avoiding distortion of the output signal when the protection circuit is not fully activated. In a frequency-compensated second amplifier stage the amplifier arrangement has an open-loop gain which rolls off as a function of the frequency with 6 dB/octave from the first angular frequency and with 12 dB/octave above a second angular frequency. In order to obtain a well-defined gain it is customary to apply negative feed-back to the amplifier by means of a negative-feedback network which is external to the integrated circuit and which is arranged between the output of the amplifier arrangement and the inverting input of the amplifier arrangement. Generally, this negative feedback network comprises a resistor arrangement between the output and the inverting input and a second resistor and a capacitor arranged in series between the inverting input and a reference potential. The capacitance of the capacitor is selected to obtain substantially full d.c. negative feedback. For the frequency spectrum of the signals to be amplified the reactance of the capacitor is so small that the negative feedback in this frequency spectrum depends almost wholly on the first and the second resistors. For a stable gain the negative feedback factor which is defined by these resistors should be smaller than a specific maximum value in order to ensure that the third angular frequency for which the openloop gain of the amplifier arrangement is equal to the inverse of the negative feedback factor, is equal to or preferably lower than the second angular frequency and is situated at some distance from this frequency. Within the frequency range of the amplifier arrangement the protection circuit described in said patent applications exhibits a portion which rolls off with the frequency and a frequency-independent portion around the maximum third angular frequency. The latter is necessary in order to obtain a stable loop gain the protection loop when the protection circuit is active. For the maximum third angular frequency, where the loop gain of the protection loop becomes unity, the phase-shift in the loop must be smaller than 180° so that the frequency roll-off must be smaller than 12 dB/octave.

The frequency dependence of the protection circuit is achieved by a means of a frequency-dependent network comprising a resistor and a capacitor connected in series. When the load of the amplifier arrangement is short-circuited it is found that the gain-frequency characteristics substantially towards lower frequencies. In order to ensure that the amplifier arrangement with the protection circuit remains stable the frequency-independent portion of the gain of the protection circuit should cover a comparatively wide frequency range around the maximum third angular frequency. This is made possible by shifting the gain-frequency characteristic of the protection circuit towards the lower frequencies. However, this demands the use of larger capacitances which, when integrated, occupy a substantial integration area.

SUMMARY OF THE INVENTION

The invention therefore ains at an amplifier arrangement comprising a protection circuit which remains stable when the load is short-circuited without the use of additional large capacitances. To this end an amplifier arrangement of the type specified in the opening paragraph is characterized in that the output of the protection circuit is connected to the junction point of the second resistor and the capacitor. The voltage appearing on the capacitor is proportional to the output signal of the protection circuit. This voltage is added to the normal negative-feedback voltage from the voltage divider comprising the first and the second resistor and is applied to the inverting input of the amplifier arrangement, resulting in a substantial negative feedback and consequently a substantial reduction in gain when the protection circuit is activated. Thus, the total gain of the amplifier arrangement is utilized, so that the protection circuit is rapidly fully activated, thereby precluding distortion of the output signal due to the protection circuit not being fully active. At increasing frequencies the negative-feedback factor is reduced by the protection circuit because the reactance of the capacitor descreases, so that at a comparatively low signal frequency the negative feedback changes to the normal negative feedback provided by the first and second resistor. Since even in the case of a short-circuit the amplifier arrangement remains stable when the negative feedback is normal, this precludes the occurrence of instability in the protection loop. Since use is made of a capacitor which is present anyway, large additional capacitors are not necessary.

In another embodiment of the invention the protection circuit itself is frequency-independent. Then the protection circuit need not comprise any integrated capacitors at all. With respect to the protection circuit, the amplifier arrangement in accordance with the invention may be characterized further in that the protection circuit comprises a detection circuit for supplying an output current which is a measure of the load of the first output transistor, a threshold circuit which supplies a measured current if the output current of the detector circuit exceeds a threshold, which output current is applied to an output circuit having an output connected to the junction point of the second resistor and the capacitor.

A suitable embodiment of the invention may be characterized further in that the output circuit comprises a first transistor in whose emitter line a third resistor is arranged, the voltage across the third resistor or a voltage which corresponds to said voltage is applied between the base of a second transistor and that end of a fourth resistor in the emitter line which is remote from the emitter, and the collector of the second transistor is coupled to the junction point of the second resistor and the capacitor. This embodiment may be characterized further in that a current-limiting resistor is arranged in the collector line of the second transistor.

In a further embodiment of the invention the threshold circuit comprises a current source and a clamping circuit which drains the excess current from the current source when the output current of the detection circuit does not exceed the current from said current source.

In another preferred embodiment of the invention the second amplifier stage comprises a second output transistor which is operated in push-pull with the first output transistor, and a second protection circuit for protecting the second output transistor, the output of the second protection circuit being also connected to the junction point of the second resistor and the capacitor.

BRIEF DESCRIPTION OF THE DRAWING

The invention will now be described in more detail, by way of example, with reference to the drawings, in which.

DESCRIPTION OF THE PREFERRED EMBODIMENTS

Figure 1:
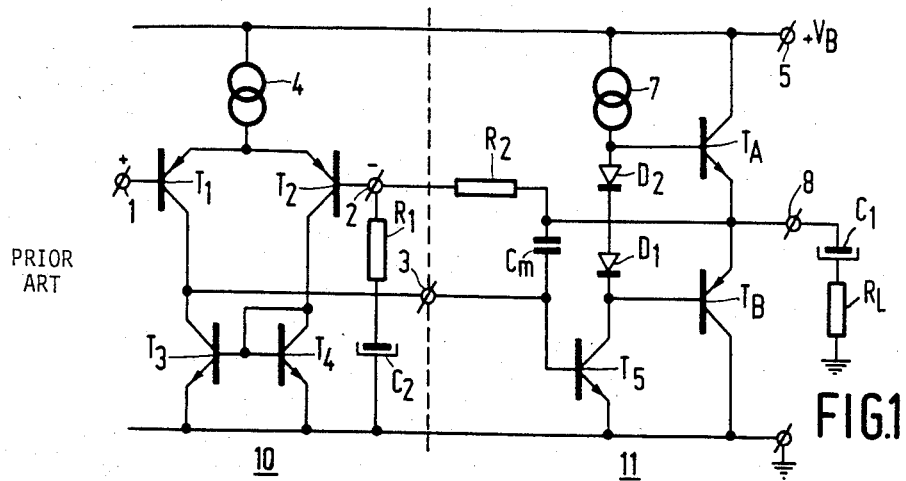
FIG. 1 shows the circuit diagram of a known amplifier arrangement.

FIG. 1 shows the circuit diagram of a known amplifier arrangement which may be provided with a protection circuit so as to obtain an amplifier arrangement in accordance with the invention. This amplifier arrangement is of the same type as the integrated operational amplifiers which are commercially available under type number uA 741. The amplifier arrangement comprises a first amplifier stage 10 having the nature of a voltage-current converter. The stage 10 comprises a pair of transistors $T_1$ and $T_2$ arranged as a differential amplifier, the base of transistor $T_1$ being the non-inverting input 1 and the base of transistor $T_2$ being the inverting input 2 of the amplifier arrangement. The emitters of the transistors $T_1$ and $T_2$ are connected to the positive power-supply terminal 5 by means of a current source 4. The collector of transistor $T_2$ is connected to the output 3 of the stage 10 by means of a current mirror comprising transistors $T_3$ and $T_4$. The collector of the transistor $T_1$ is also connected to this output 3. This output 3 also constitutes the input of the second amplifier stage 11, which has the nature of a current-voltage converter. This stage 11 comprises a driver stage with a driver transistor $T_5$, diodes $D_1$ and $D_2$, and a current source 7, which drives a class-B output stage comprising output transistors $T_A$ and $T_B$. A load $R_L$ is coupled to the output 8 of the output stage via a capacitor $C_1$. The amplifier arrangement is frequency-compensated by a Miller capacitor $C_m$, arranged between the base of the driver transistor $T_5$ and the output 8. External negative feedback is applied to the amplifier arrangement by means of a negative feedback network arranged between the output 8 and the inverting input 2 of the amplifier arrangement. This negative feedback network is a frequency-dependent voltage divider comprising a resistor $R_2$ arranged between the output 8 and the inverting input 2 and a resistor $R_1$ and a capacitor $C_2$ arranged in series between the input 2 and earth.

Figures 2, 3:
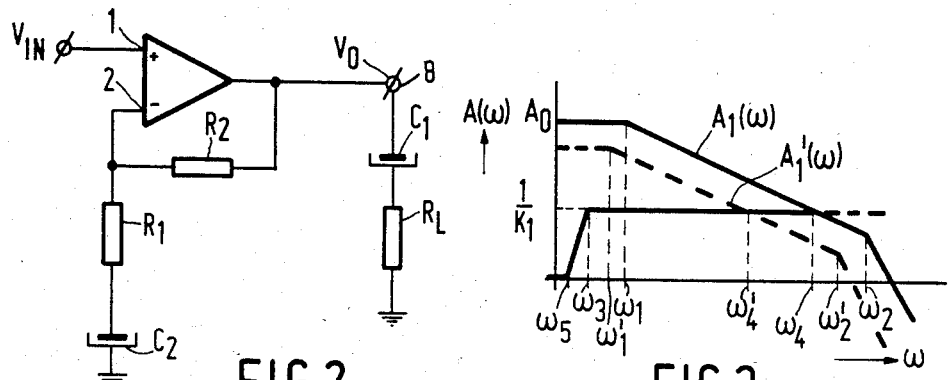
FIG. 2 shows the block diagram of the amplifier arrangement shown in FIG. 1.
FIG. 3 shows gain-frequency characteristics of the amplifier arrangement shown in FIG. 2.

FIG. 2 shows the block diagram of the amplifier arrangement shown in FIG. 1. In FIG. 3 the open-loop gain $A_1(\omega)$, i.e. the gain of the amplifier arrangement without negative feedback, is plotted as a function of the frequency. For low frequencies the gain $A_1(\omega)$ is equal to $A_0$. From a certain angular frequency $\omega_1$ which is determined by the compensation capacitor $C_m$ the gain rolls off with 6 dB/octave up to a frequency $\omega_2$, above which the gain rolls off with 12 dB/octave owing to a further time constant of the amplifier.

If negative feedback is applied to the amplifier arrangement by means of the network $R_1$, $R_2$, $C_1$ the closed-loop gain for $K_2 > 1$ becomes equal to $A_2 = K_2^{-1}$, the negative feedback factor being given by:

$$K_2 = \frac{R_1 + (j\omega C_2)^{-1}}{R_1 + R_2 + (j\omega C_2)^{-1}} \qquad (1)$$

Foe very low frequencies the reactance of the capacitor $C_2$ is very large, so that in conformity with equation (1) the negative feedback factor is substantially equal to unity, resulting in substantially full d.c. negative feedback. As a result of this, the direct voltage on the inverting input of the amplifier arrangement is equal to the direct voltage of the non-inverting input, which is generally set to half the power-supply voltage by means of a voltage divider. For low frequencies, for which the reactance of the capacitor $C_2$ is large relative to that of the resistor $R_1$, the negative feedback factor $K_2$ depends almost entirely on $R_2$ and $C_2$. For angular frequencies above the cross-over frequency $\omega_5 = (R_2 C_2)^{-1}$ the reactance of the capacitor $C_2$ decreases. For audio amplifiers this angular frequency is generally selected to be equal to $f_5 = \omega_b/2\pi \approx 20$ Hz. The value of the capaciror $C_2$ is then of the order of 10 to 20 $\mu F$. For angular frequencies above the 3 dB frequency $\omega_3 = (R_1 C_2)^{-1}$, the reactance of the capacitor $C_2$ is so small that it may be regarded as a short circuit. The closed-loop gain then becomes equal to $A_2 = K_1^{-1}$, the negative feedback factor $K_1$ being given by:

$$K_1 = \frac{R_1}{R_2 + R_1} \qquad (2)$$

For a frequency $\omega_4$ the open-loop gain $A_1(\omega) = K_1^{-1}$. Above this frequency the amplifier with negative feedback has the same frequency response as the amplifier without negative feedback. In order to ensure that the amplifier with negative feedback remains stable the frequency roll-off at the angular frequency $\omega_4$ should not exceed 6 dB/octave. ($\omega_4 < \omega_2$) therefore, the negative feedback factor $K_1$ should not exceed a specific maximum value. If the load has a low impedance or is substantially short-circuited the gain-frequency characteristic is shifted towards lower frequencies, as is indicated by $A_1'(\omega)$ in the Figure, so that the angular frequency $\omega_2$ is also shifted towards lower frequencies. The maximum negative feedback factor $K_1$ is then dictated by the fact that the frequency $\omega_1'$ for which the open-loop gain $A_1'(\omega) = K^{-1}$ must be lower than $\omega_2'$.

Figures 4, 5:
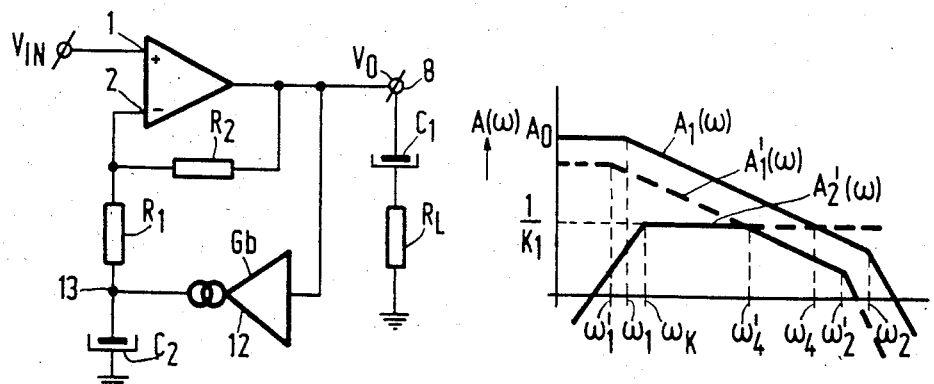
FIG. 4 shows the block diagram of an amplifier arrangement in accordance with the invention.
FIG. 5 shows gain-frequency characteristics of the amplifier arrangement shown in FIG. 4.

FIG. 4 shows the block diagram of an amplifier arrangement in accordance with the invention comprising a protection circuit. The protection circuit derives its information from the emitter or the collector current and the collector-emitter voltage of an output transistor. If the protection circuit is activated it constitutes a transconductance amplifier 12 having a transconductance $G_b$ between the output 8 of the amplifier arrangement and the junction point 13 between the resistor $R_1$ and the capacitor $C_2$. The output voltage $V_o$ of the amplifier arrangement 1 constitutes the input voltage of the transconductance amplifier 12, which converts this voltage into an output current $G_b V_o$. The transconductance $G_b$ of the amplifier 12 comprises a term determined by the current through the output transistor, which is inversely proportional to the load resistance $R_L$, because this current is equal to the quotient of the output voltage $V_o$ and said load resistance $R_L$ and a term which is determined by the collector-emitter voltage and which is independent of the load resistance. The output current $G_b V_o$ is integrated in capacitor $C_2$ and results in a voltage which together with the negative feedback voltage produced by the voltage divider comprising the resistors $R_1$ and $R_2$ is fed to the inverting input of the amplifier arrangement. When the protection circuit is active the overall negative feedback factor for frequencies higher than $\omega_3$ (see FIG. 3) is substantially equal to:

$$K_2' = K_1 + \frac{G_b}{j\omega C_2} \quad (3)$$

As the transconductance $G_b$ is inversely proportional to the load resistance $R_L$ the transconductance is large when the load is short-circuited. For low frequencies in the case of a short-circuit the negative-feedback factor $K_2'$ is very large, so that the amplifier receives a substantial negative feedback. The closed-loop gain $A_2' = K_2'^{-1}$ is then small, so that the protection circuit provides a substantial reduction in the gain and hence a satisfactory protection. For this purpose the overall gain of the amplifier arrangement is utilized, so that the protection circuit operates accurately, distortion of the output signal being precluded because the protection circuit is not fully active. When the frequencies increase the negative feedback factor decreases as a result of the presence of the protection circuit. For angular frequencies above the 3-dB frequency $\omega_k = g_b/K_1 C_2$ the negative-feedback factor is equal to $K_2' = K_1$, so that the closed-loop gain is equal to $A_2' = K_1^{-1}$. The necessity of a substantial reduction in gain in particular for low frequencies arises because at these frequencies in the case of peak loads the output transistors may become locally heated to such an extent that these transistors are damaged. For higher frequencies the heat distribution in the integrated circuit is more uniform so that in the case of excessive loads the thermal cut-out protection of the amplifier circuits in the integrated circuit is activated. FIG. 5 shows the gain-frequency characteristics, in which $A_1(\omega)$ and $A_1'(\omega)$ represent the open-loop gain in the case of a normal load and in the case of a low-impedance load or a nearly short-circuited load, and $A_2'(\omega)$ represents the closed-loop gain in the case of a substantially full short circuit, the value of the angular frequency $\omega_k$ being dependent on the degree of short-circuiting. When the load is short-circuited the angular frequency $\omega_4'$ for the closed-loop gain. For audio amplifiers this frequency may be selected to be substantially equal to $\omega_k/2\pi = 500$ Hz. This defines the magnitude of the transconductance $G_b$ in the case of a short circuit for the specified values of the capacitor $C_2$ and the resistors $R_1$ and $R_2$ and hence of the negative feedback factor $K_1$. Since the negative feedback changes to the normal negative feedback at comparatively low frequencies and the amplifier with normal negative feedback also remains stable when the load is short-circuited, this precludes instabilities which otherwise occur around the frequency where the loop gain in the protection loop would become equal to unity.

Figure 6:
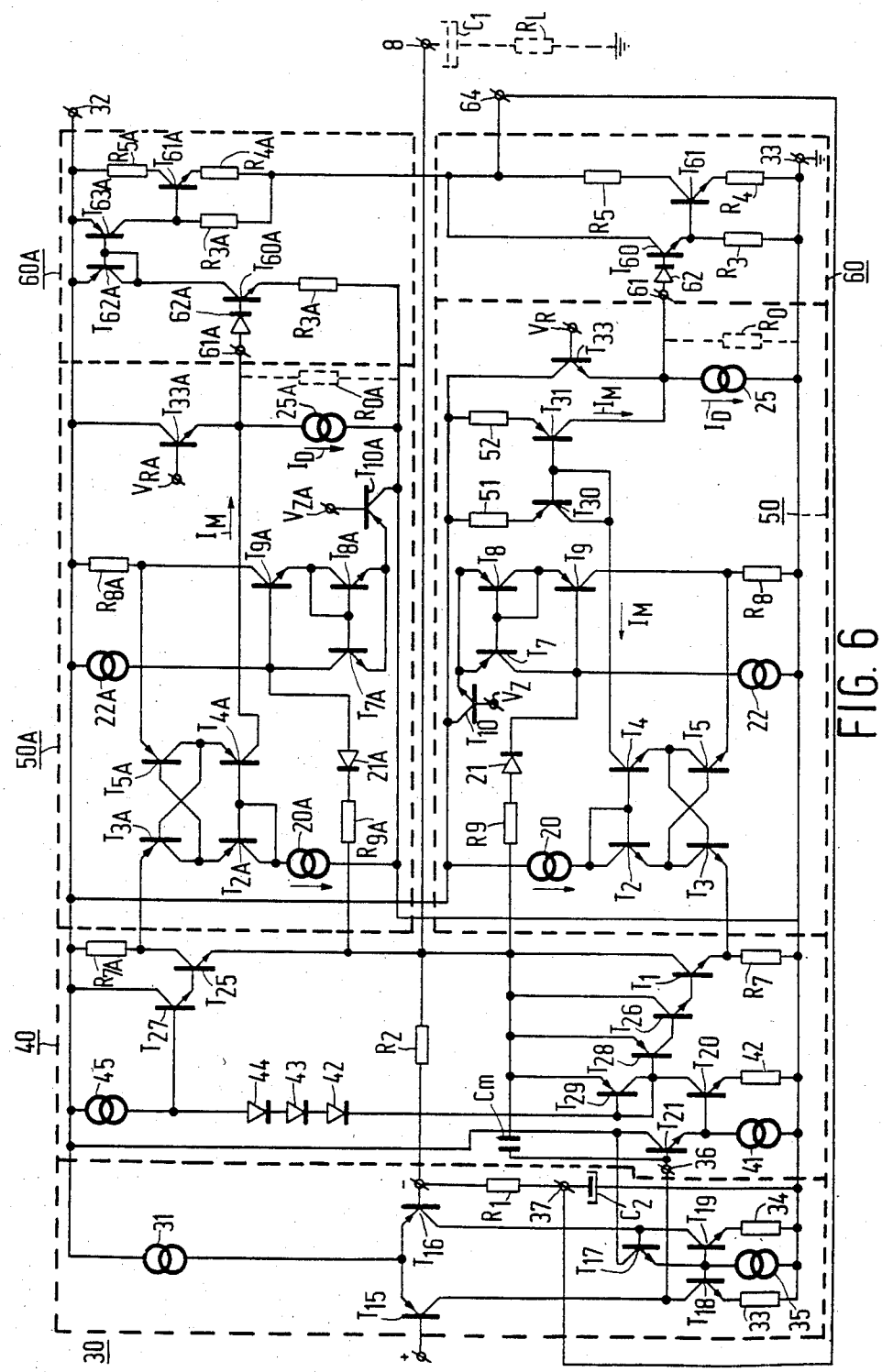
FIG. 6 shows an amplifier arrangement in accordance with the invention comprising a protection circuit.

FIG. 6 shows a practical example of an amplifier arrangement in accordance with the invention. The amplifier arrangement comprises a first stage 30 having the nature of a voltage-current converter comprising a pair of transistors $T_{15}$ and $T_{16}$ arranged as a differential amplifier, the bases of said transistors respectively constituting the non-inverting input and the inverting input. The emitters of the transistors $T_{15}$ and $T_{16}$ are connected to the positive power-supply terminal 32 via a current source 31. The collectors of the transistors $T_{15}$, $T_{16}$ are connected to the output 36 of said stage 30 via a current mirror $T_{17}$, $T_{18}$, $T_{19}$ comprising resistors 33 and 34 and a current source 35. The output 36 also constitutes the input 36 of a second stage 40 which has the nature of a current-voltage converter. The input 36 is connected to the output 8 by means of a compensation capacitor $C_m$. This stage 40 comprises a driver transistor $T_{20}$ with an emitter resistor 42, which is driven by the emitter-follower arrangement comprising transistor $T_{21}$ and the current source 41 and whose collector is connected to the positive power-supply terminal 32 via diodes 42, 43, 44 and a current source 45. The output stage is a quasi-complementary output stage comprising NPN output transistors $T_1$ and $T_{25}$ which together with the NPN transistors $T_{26}$ and $T_{27}$ respectively constitute Darlington transistors. The quasi-complementary behaviout is obtained by adding PNP transistor $T_{28}$ and $T_{29}$ as is indicated in the Figure.

A load $R_L$ is coupled to the output 8 of the amplifier arrangement by means of a capacitor $C_1$. Further, a negative-feedback network is arranged between the output 8 and the inverting input of the stage 30, which network comprises a resistor $R_2$ arranged between the output 8 and the inverting input and a resistor $R_1$ and a capacitor $C_2$ arranged in series between the inverting input and the negative power-supply terminal 33, in the present case earth.

The protection circuit for the transistor $T_1$ to be protected comprises a detection circuit 50 which supplies an output current which is a measure of the overload when the protection circuit is activated. A resistor connected to the output of the detection circuit converts this current into a voltage which is re-converted into an output current by means of a voltage-current converter 60, which output current is applied to the junction point 37 of the resistor $R_1$ and the capacitor $C_2$. A resistor $R_7$ is arranged in the emitter line of the transistor $T_1$. A first signal, which is proportional to the current through transistor $T_1$, is derived from the voltage across said resistor. The resistor $R_7$ forms part of a current-mirror circuit which constitutes a voltage-current converter. The current-mirror circuit comprises a first path comprising a current source 20, a diode-connected transistor $T_2$, a transistor $T_3$, and the resistor $R_7$, and a second parth comprising transistors $T_4$, $T_5$ and a resistor $R_8$. The transistors $T_2$ and $T_4$ have commoned bases and the base of transistor $T_3$ is connected to the collector of transistor $T_5$ whose base is connected to the collector of transistor $T_3$. Since the collector current of transistor $T_4$ is substantially equal to that of transistor $T_5$ and since the collector current of transistor $T_2$ is substantially equal to that of transistor $T_3$, the sum of the base-emitter voltages of transistors $T_3$ and $T_4$ is equal to that of the transistors $T_2$ and $T_5$. The collector current of transistor $T_4$ is then such that the coltages across the resistors $R_7$ and $R_8$ are substantially equal. The emitter current $I_E$ of transistor $T_1$ produces a current:

$$\frac{R_7}{R_8} \cdot I_E \qquad (4)$$

in the collector circuit of transistor $T_4$ if a d.c. bias term produced by the current source 20 and the collector current of transistor $T_9$ are ignored. The direct current term is compensated for by an equal term in the current from the current source 25, which last-mentioned term does not affect the operation of the protection circuit and is therefore ignored in further calculations.

By means of a resistor $R_9$ and a diode 21 the collector of transistor $T_1$ is coupled to the input of a current mirror comprising transistors $T_7$, $T_8$ and $T_9$. Furthermore, a current source 22 producing a current $kI_D$ is coupled to the input of the current mirror. The commoned emitters of the transistors $T_7$, $T_8$ are connected to the emitter of a transistor $T_{10}$, whose base carries a reference voltage $V_Z$. The output current of the current mirror $T_7$, $T_8$, $T_9$ is applied to the resistor $R_8$.

The voltage on the cathode of the diode 21 is substantially equal to $V_Z - 3 V_{BE}$, in which the $V_{BE}$s are the base-emitter voltages of transistors $T_8$, $T_9$ and $T_{10}$. The diode 21 is then cut off for voltages on output 8 which are smaller than $V_Z - 2 V_{BE}$. The current $kI_D$ from the current source 22 is then fully reflected to the resistor $R_8$. The total collector current $I_M$ of the transistor $T_4$ is then $$I_M = \frac{R_7}{R_8} \cdot I_E - kI_D \qquad (5)$$

Firstly, this current is reproduced by means of a current mirror comprising transistors $T_{30}$, $T_{31}$ and resistors 51 and 52 and subsequently it is compared with the current $I_D$ from a current source 25. If the measurement current $I_M$ is larger than the current $I_D$ the protection circuit is activated. The difference between the currents $I_M - I_D$ is converted into a voltage by a resistor $R_0$ which is measured at the input 61, which voltage is applied to the input 61 of the coltage-current converter 60. The resistance $R_o$ measured at the input 61 is constituted by the parallel connection of the output resistance of the current sources $I_D$ and $I_M$ and the input resistance of the circuit 60. If the output resistance is substantially smaller than the input resistance the resistance $R_o$ will be substantially equal to the output resistance of the current sources. The input 61 is connected to transistor $T_{33}$ whose base is at a reference voltage $V_R$. This step serves to ensure that the protection circuit 50 is not activated when this is not necessary. The current $I_M$ is then smaller than the current $I_D$ from the current source 25. The transistor $T_{33}$ is now kept conductive by the excess current from the current source 25. The voltage $V_R$ is then such that diode 62 is cut off when the protection circuit is not activated. Transistor $T_{33}$ is cut off at the instant that the protection circuit is activated and diode 62 is turned on. The cathode of diode 62 is connected to the base of an emitter-follower transistor $T_{60}$ in whose emitter line a resistor $R_3$ is arranged and whose emitter is connected to the base of a transistor $T_{61}$ in whose emitter line a resistor $R_4$ is arranged. A resistor $R_5$ is arranged in the collector line of transistor $T_{61}$ to limit the maximum current through this transistor. The output 64 of the voltage-current converter 60 is coupled to the junction point 37 between the resistor $R_1$ and the capacitor $C_2$.

The output current fed to the junction point 37 is equal to $G_b V_o$, the transconductance being given by:

$$G_b = \frac{R_o}{R_L R_4} \cdot \frac{R_7}{R_8} \qquad (6)$$

This may be explained as follows. A variation in the current of transistor $T_1$ results in a variation of the current $I_M$ which depends only on the ratio of the resistors $R_7$ and $R_8$ if the resistors 51 and 52 have equal values. $R_0$ converts this current variation into a voltage variation which appears almost fully across the resistor $R_4$ via the emitter follower configuration $T_{60}$, $R_3$ and results in a current variation which is inversely proportional to the value of this resistor. A variation in the current of transistor $T_1$ also results in a variation of the voltage on output 8, which voltage variation is proportional to the load $R_L$. The transconductance in conformity with equation (6) follows from the current variation on output 64 and the voltage variation on output 8.

For a value of $G_b$ determined by the values of $R_1$, $R_2$, $C_2$ and $\omega_k$ (see FIG. 5) when the load is short-circuited and when $R_L$ has a specific small value and for a given ratio of the values of the resistors $R_7$ and $R_8$, the desired ratio between the resistance values of $R_0$ and $R_4$ follows from equation (6). If $R_0$ is known this will yield the value of the resistor $R_4$. Transistor $T_1$ is driven by a voltage on the non-inverting input of amplifier stage 30, which voltage is lower than the voltage on the inverting input. The voltage on output 8 descreases if the current through transistor $T_1$ increases. When the protection circuit is activated the output current $G_b V_o$ of the voltage-current converter 60 is drained from capacitor $C_2$, so that a voltage across this capacitor decreases. In conjunction with the negative feedback by means of voltage divider $R_1$, $R_2$ this provides a substantial decrease of the voltage on the inverting input. This negative feedback limits the current through transistor $T_1$, so that the voltage on output 8 increases again. The current through transistor $T_1$ is limited in such a way that the current $I_M$ becomes equal to the current $I_D$. As a result of this, the current $I_E$ is limited to the maximum value:

$$I_E\text{max} = \frac{R_8}{R_7}(1 + k)I_D \qquad (7)$$

For voltages on output 8 which are higher than $V_Z-2V_{BE}$ diode 21 is turned on, so that a part of the current $kI_D$ will flow through the resistor $R_9$ when the collector-emitter voltage increases. As a result of this, the limit value of the emitter current $I_E$ will decrease as a linear function of the increasing collector-emitter voltage $V_{CE}$.

If the voltage on output 8 reaches the value of the knee voltage $V_k = V_Z - 2V_{BE} + kI_DR_9$, the entire current $kI_D$ from the current source 22 will flow through the resistor $R_9$ and no current will flow in the current mirror $T_7$, $T_8$, $T_9$. The current $I_M$ then becomes equal to:

$$I_M = \frac{R_7}{R_8} \cdot I_E \qquad (8)$$

so that the current $I_E$ is limited to a residual value which is equal to:

$$I_E = \frac{R_8}{R_7} \cdot I_D \qquad (9)$$

This residual current ensures that the circuit is capable of supplying the required current for the quiescent-current setting when the power supply is switched on. This requires, inter alia a small current for charging the capacitor $C_1$ when the power-supply voltage is switched on. A small quiescent current is also required in order to preclude the distortion occurring when the current through transistor $T_1$ ceases to flow in the case of large drive signals. Output transistor $T_{25}$ is protected in a similar manner by means of a detection circuit 50A and a voltage-current converter 60A, of which corresponding parts bear the same reference numerals with a suffix A. The circuit 50A operates in the same way as the circuit 50, but now the transistors of the current mirrors $T_{3A}$ to $T_{5A}$ and $T_{7A}$ to $T_{10A}$ are complementary. As a result of this, the current $I_M$ need not be inverted by a current mirror before it is applied to the input 61A of the voltage-current converter 60A. Because of the complementary operation of the transistors $T_1$ and $T_{25}$ the output current $G_bV_o$ of the voltage-current converter 60A must be inverted in comparison with that of the voltage-current converter 60 when the protection circuit is activated. For this purpose the current through a resistor $R_{3A}$ is reproduced by means of a current mirror comprising transistors $T_{62A}$ and $T_{63A}$ and is subsequently converted into voltage across an identical resistor $R_{3A}$, which voltage is applied between the base of transistor $T_{61A}$ and that end of the resistor $R_{4A}$ which is remote from this transistor. Further, the voltage-current converter operates in the same way as the voltage-current converter 60.

The above embodiment utilizes an asymmetrical supply voltage. The invention may also be used in conjunction with symmetrical supply voltages, in which case the coupling capacitor for the load may be dispensed with.

It will be evident that the invention is not limited to the embodiment shown but that many modifications which can provide the desired protection are possible within the scope of the invention. For example, many variants of the voltage-current converters and the detection circuit will be obvious to those skilled in the art.

What is claimed is:

1. In an amplifier arrangement comprising means for furnishing a reference potential, a first amplifier stage having a first amplifier input, a second input, and a first amplifier output, a second amplifier stage connected in cascade with said first amplifier stage, said second amplifier stage having at least a first output transistor and a second amplifier output coupled to said transistor, a negative-feedback network comprising a first resistor arranged between said second amplifier stage and said first amplifier input and a series circuit arranged between said first input and said reference potential and comprising a second resistor and a capacitor connected to said second resistor at a junction point, and a protection circuit for protecting said first output transistor, said protection circuit having an output, the improvement comprising:
   means for connecting said output of said protection circuit to said junction point of said second resistor and said capacitor.

2. An amplifier arrangement as claimed in claim 1, wherein said the protection circuit is frequency-independent.

3. An amplifier arrangement as claimed in claim 1 wherein said protection circuit comprises a detection circuit for supplying an output current constituting a measure of the load of said first output transistor, threshold circuit means for supplying a measured current if said output current of said detection circuit exceeds a threshold value, further comprising output circuit means having an output connected to said junction point of said second resistor and said capacitor, and wherein said output current is applied to said output circuit.

4. An amplifier arrangement as claimed in claim 3, characterized in that the output circuit comprises a first transistor having an emitter, a third resistor connected to said emitter, the voltage across the third resistor or a voltage which corresponds to this voltage is applied between the base of a second transistor and that end of a fourth resistor in the emitter line which is remote from the emitter, and the collector of the second transistor is coupled to the junction point of the second resistor and the capacitor.

5. An amplifier arrangement as claimed in claim 4, characterized in that a current-limiting resistor is arranged in the collector line of the second transistor.

6. An amplifier arrangement as claimed in claim 3, characterized in that the threshold circuit comprises a current source and a clamping circuit which drains the excessive current from the current source when the output current of the detection circuit does not exceed the current from said current source.

7. An amplifier arrangement as claimed in any one of the preceding claims, characterized in that the second amplifier stage comprises a second output transistor which is operated in push-pull with the first output transistor, and a second protection circuit for protecting the second output transistor, the output of the second protection circuit also being connected to the junction point of the second resistor and the capacitor.

8. An integrated amplifier arrangement comprising a first amplifier stage having a first input which is the inverting input of the amplifier arrangement, a second input which is the non-inverting input of the amplifier arrangement, and an output, a second amplifier stage having an input which is coupled to the output of the first amplifier stage, at least a first output transistor, and an output which is coupled to said transistor, first connection means for connecting a negative-feedback network between the output of the second amplifier stage and the inverting input, which network comprises a first resistor arranged between said output and the inverting input and a second resistor and a capacitor arranged in series between the inverting input and a reference potential, and a protection circuit for protecting the first output transistor said protection circuit having an output, characterized in that the amplifier arrangement comprises second connection means for connecting the output of the protection circuit to the junction point of the second resistor and the capacitor.

* * * * *